United States Patent
Rai et al.

(10) Patent No.: US 7,542,349 B2
(45) Date of Patent: Jun. 2, 2009

(54) SEMICONDUCTOR MEMORY DEVICE

(75) Inventors: Toshiki Rai, Gifu (JP); Sadao Yoshikawa, Gifu (JP)

(73) Assignees: SANYO Electric Co., Ltd., Osaka (JP); SANYO Semiconductor Co., Ltd., Gunma (JP)

( * ) Notice: Subject to any disclaimer, the term of this patent is extended or adjusted under 35 U.S.C. 154(b) by 51 days.

(21) Appl. No.: 11/946,674

(22) Filed: Nov. 28, 2007

(65) Prior Publication Data

US 2008/0130374 A1   Jun. 5, 2008

(30) Foreign Application Priority Data

Nov. 30, 2006   (JP)   ............... 2006-323022

(51) Int. Cl.
    *G11C 16/06*   (2006.01)
(52) U.S. Cl. .................. 365/185.23; 365/185.22; 365/185.18; 365/185.05; 365/230.06; 365/242
(58) Field of Classification Search ........... 365/185.23, 365/185.2, 185.05, 230.06, 242, 185.182
    See application file for complete search history.

(56) References Cited

U.S. PATENT DOCUMENTS 6,954,400 B2 * 10/2005 Lakhani et al. ........ 365/230.06
7,133,323 B2 * 11/2006 Lakhani et al. ........ 365/230.06

FOREIGN PATENT DOCUMENTS

JP   2000-173278   6/2000

* cited by examiner

*Primary Examiner*—Connie C Yoha
(74) *Attorney, Agent, or Firm*—Morrison & Foerster LLP

(57) ABSTRACT

The invention provides a semiconductor memory device where a circuit area is minimized and a voltage drop in a high voltage supply path to a source line is reduced. An output of a high voltage generation circuit is connected to a source line through a first transfer gate, and connected to a word line through a second transfer gate. The first transfer gate is configured of a P-channel type MOS transistor of which on and off are controlled by a write enable signal, and the second transfer gate is configured of a P-channel type MOS transistor of which on and off are controlled by an erase enable signal. A third transfer gate supplying the output of the high voltage generation circuit to the source line without through a high voltage switching circuit is further provided. The third transfer gate is configured of a P-channel type MOS transistor and an inverted output of the high voltage switching circuit is applied to the gate thereof.

4 Claims, 3 Drawing Sheets

SEMICONDUCTOR MEMORY DEVICE

CROSS-REFERENCE OF THE INVENTION

This application claims priority from Japanese Patent Application No. 2006-323022, the content of which is incorporated herein by reference in its entirety.

BACKGROUND OF THE INVENTION

1. Field of the Invention

The invention relates to a semiconductor memory device, particularly, a semiconductor memory device having a plurality of electrically data erasable and writable nonvolatile memory cell transistors.

2. Description of the Related Art

Recently, the nonvolatile memory is used not only for consumer goods such as a mobile, a digital camera and the like but also for on-vehicle, aerial or medical equipments, an ID card and the like which require high reliability in data storage.

The EEPROM (Electronically Erasable and Programmable Read Only Memory) is known as a general nonvolatile memory. This stores binary or multivalued digital data depending on whether or not a predetermined charge amount is accumulated in a floating gate and reads the digital data by sensing the change of a channel conductance according to this charge amount. This EEPROM includes a stacked gate type EEPROM having a structure where a floating gate and a control gate are sequentially stacked on a semiconductor substrate and a split gate type EEPROM having a structure where a floating gate and a control gate face a channel of a semiconductor substrate.

FIG. 3 is a cross-sectional view showing one memory cell transistor MT of the split gate type EEPROM. An n$^+$-type drain 102 and an n$^+$-type source 103 are formed on a front surface of a P-type semiconductor substrate 101 at a given distance from each other, and a channel 104 is formed therebetween. A floating gate 106 is formed on a portion of this channel 104 and a portion of this source 103 with a gate insulation film 105 being interposed therebetween. An insulation film 107 thicker than the gate insulation film 105 is formed on the floating gate 106.

A tunnel insulation film 108 is formed covering the side surface of the floating gate 106 and a portion of the upper surface of the thick insulation film 107. A control gate 109 is formed on the tunnel insulation film 108 and a portion of the channel 104.

The operation of the memory cell transistor MT having this structure is as follows.

First, when data "0" is written, a predetermined voltage is applied to the control gate 109 and the P-type semiconductor substrate 101 (e.g. 0V to the P-type semiconductor substrate 101 and 2V to the control gate 109) and a high voltage (e.g. 10V) is applied to the source 103 to flow a current through the channel 104, and thereby channel hot electrons are injected into the floating gate 106 through the gate insulation film 105. The channel hot electrons injected into the floating gate 106 are held in the floating gate 106 as electric charge.

On the other hand, when the data "0" stored in the memory cell transistor MT is erased, the drain 102 and the source 103 are grounded and a predetermined high voltage (e.g. 13V) is applied to the control gate 109 to flow a Fowler-Nordheim tunneling current through the tunnel insulation film 108, and thereby electrons accumulated in the floating gate 106 are extracted to the control gate 109. By this erasing, the digital data stored in the memory cell transistor MT turns to "1".

When the data stored in the memory cell is read out, a predetermined voltage is applied to the control gate 109 and the drain 102 (e.g. 3V to the control gate 109 and 1V to the drain 102). Then, a cell current Ic flows between the source and the drain according to the charge amount of electrons accumulated in the floating gate 106. When the data "0" is already written, the threshold of the memory cell transistor MT is high and thus the cell current Ic usually reduces to about 0 μA. When the data "1" is already written, the threshold of the memory cell transistor MT is low and thus the cell current Ic usually increases to about 40 μA.

Then, the data is judged to be "0" or "1" by comparing this cell current Ic with a reference current with a given sense amplifier. For example, in the case of the reference current=20 μA, when the cell current Ic has the current amount of 20 μA or more the sense amplifier senses it and outputs a voltage value of 5V (the data "1"), and when the cell current Ic has the current amount of 20 μA or less the sense amplifier outputs a voltage value of 0V (the data "0").

The described technique is described in the Japanese Patent Application Publication No. 2000-173278.

As described above, in the memory cell transistor MT, it is necessary to apply a high voltage when data is written and erased. The circuit structure of such a semiconductor memory device will be described referring to FIG. 4.

A high voltage generation circuit 1 generates a high voltage HV by boosting a supply voltage Vcc (e.g. 3V) inputted to the semiconductor memory device. A high voltage switching circuit 2 switches in response to a selection signal SEL selecting a source line SL or a word line WL, and outputs the high voltage HV generated by the high voltage generation circuit 1. Sources of a plurality of memory cell transistors MT1, MT2, MT3 and so on are commonly connected to the source line SL, and control gates of the plurality of memory cell transistors MT1, MT2, MT3 and so on are commonly connected to the word line WL. When data is written (programmed), a first transfer gate 3 is turned on and a second transfer gate 4 is turned off to apply the high voltage HV to the source line SL. When the data is erased (the program is erased), the first transfer gate 3 is turned off and the second transfer gate 4 is turned on to apply the high voltage HV to the word line WL.

When the number of the memory cell transistors MT1, MT2, MT3 and so on in which data is simultaneously written increases, however, a writing current in a high voltage supply path, i.e. in the high voltage switching circuit 2 and the first transfer gate 3 increases and thus a voltage drop (an IR drop) increases by the increase amount, so that the number of the memory cell transistors in which data is simultaneously writable is limited. On the other hand, for reducing the voltage drop in the high voltage supply path, the transistors forming the high voltage switching circuit 2 and the first transfer gate 3 need be designed to have large sizes for lowering those impedances, thereby causing a problem of a large circuit area.

SUMMARY OF THE INVENTION

The invention is made for solving the above problem and the main feature thereof is as follows. The invention provides a semiconductor memory device including: a plurality of electrically data erasable and writable nonvolatile memory cell transistors; a source line connected to sources of the nonvolatile memory cell transistors; a word line connected to control gates of the nonvolatile memory cell transistors; a high voltage generation circuit generating a high voltage for erasing and writing data; a high voltage switching circuit switching in response to a selection signal and outputting the high voltage generated by the high voltage generation circuit; a first switch becoming conductive in response to a write enable signal and outputting the high voltage outputted by the high voltage switching circuit to the source line; a second switch becoming conductive in response to an erase enable signal and outputting the high voltage outputted by the high voltage switching circuit to the word line; and a third switch becoming conductive in response to a write enable signal and outputting the high voltage generated by the high voltage generation circuit to the source line without through the high voltage switching circuit.

DETAILED DESCRIPTION OF THE INVENTION

Figure 1:
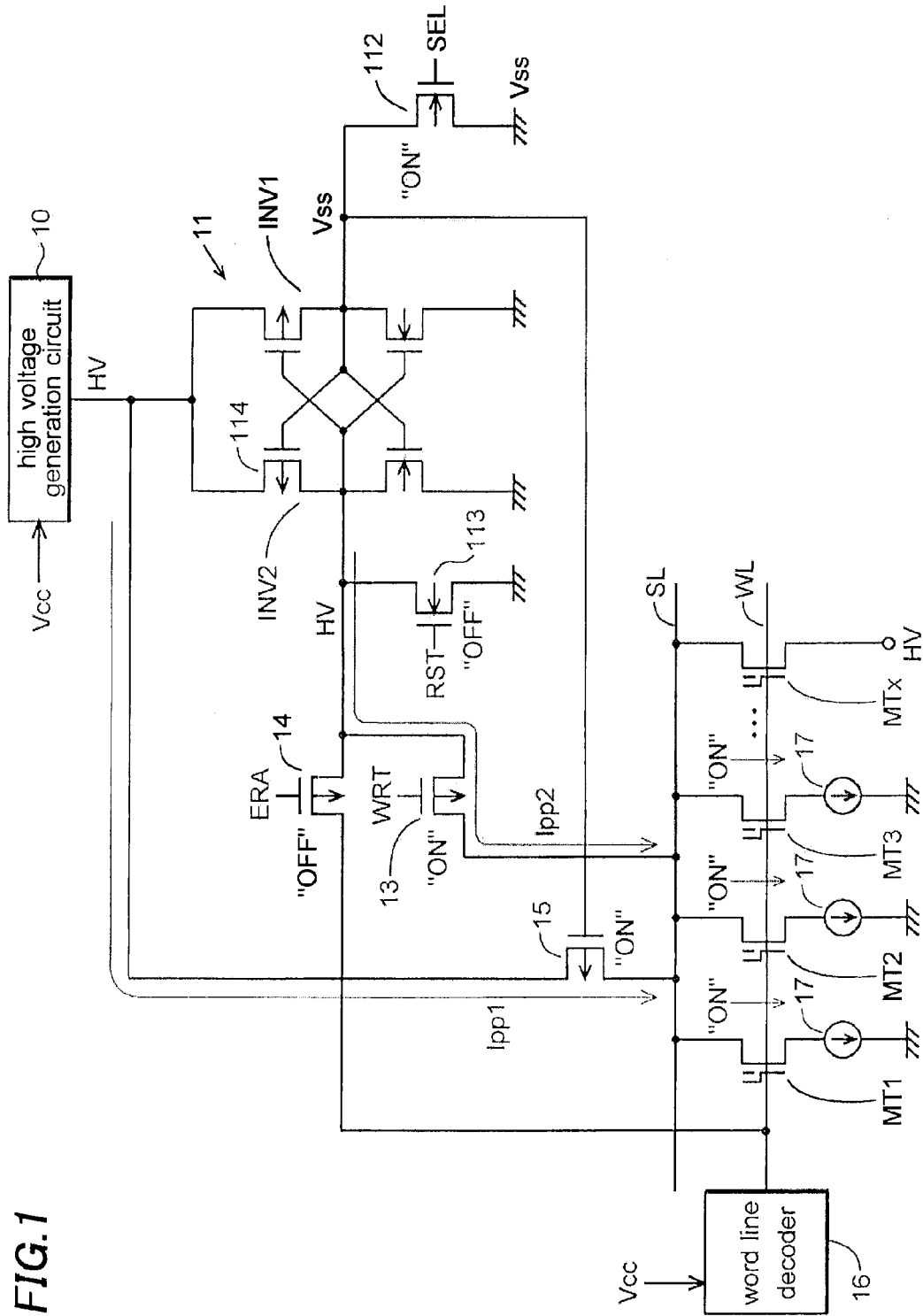
FIGS. 1 and 2 are circuit diagrams for explaining a semiconductor memory device of the invention.

A semiconductor memory device of an embodiment of the invention will be described referring to figures. FIG. 1 is a circuit diagram of the semiconductor memory device of the embodiment when data is written.

A high voltage generation circuit 10 is a circuit generating a high voltage HV by boosting a supply voltage Vcc (e.g. 3V) inputted to the semiconductor memory device, and is configured of, for example, a charge pump circuit.

A high voltage switching circuit 11 is provided in each of the groups of memory cell transistors which are connected to a common source line SL and a common word line WL, and is a circuit switching in response to a selection signal SEL selecting the source line SL or the word line WL and outputting the high voltage HV generated by the high voltage generation circuit 10. In detail, the high voltage switching circuit 11 has a first CMOS inverter INV1 and a second CMOS inverter INV2 of which the inputs and outputs are cross-connected to each other, a setting MOS transistor 112 of which the drain is connected to the output of the first CMOS inverter INV1 (the input of the second inverter INV2), the source is grounded, and on and off are controlled by a selection signal SEL, and a resetting MOS transistor 113 of which the drain is connected to the output of the second CMOS inverter INV2 (the input of the first CMOS inverter INV1), the source is grounded, and on and off are controlled by a reset signal RST.

The high voltage HV generated by the high voltage generation circuit 10 is supplied as a supply voltage on the high voltage side of the first CMOS inverter INV1 and the second CMOS inverter INV2. The high voltage switching circuit 11 is thus basically a latch circuit.

Figure 3:
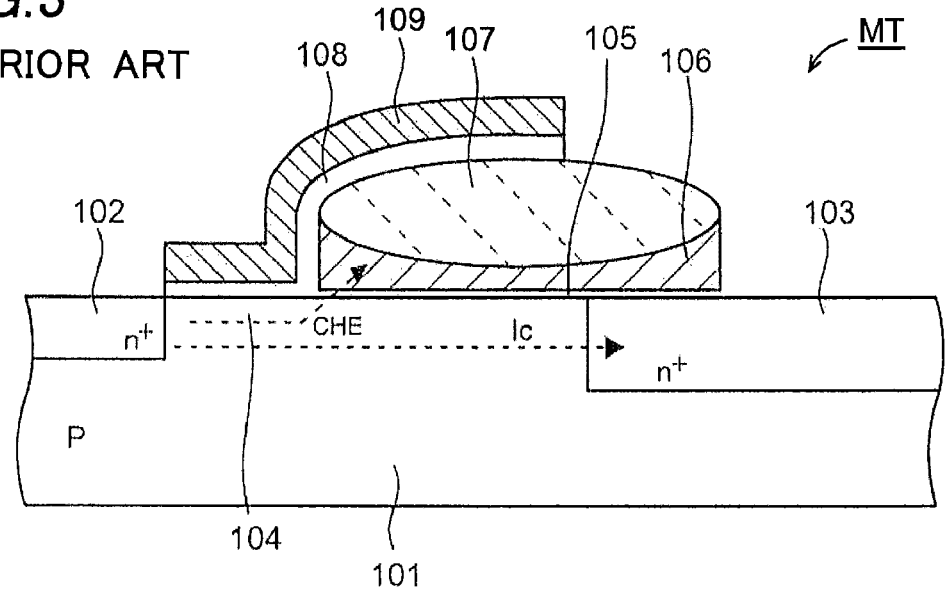
FIG. 3 is a cross-sectional view for explaining a memory cell of a split gate type EEPROM.
Figure 4:
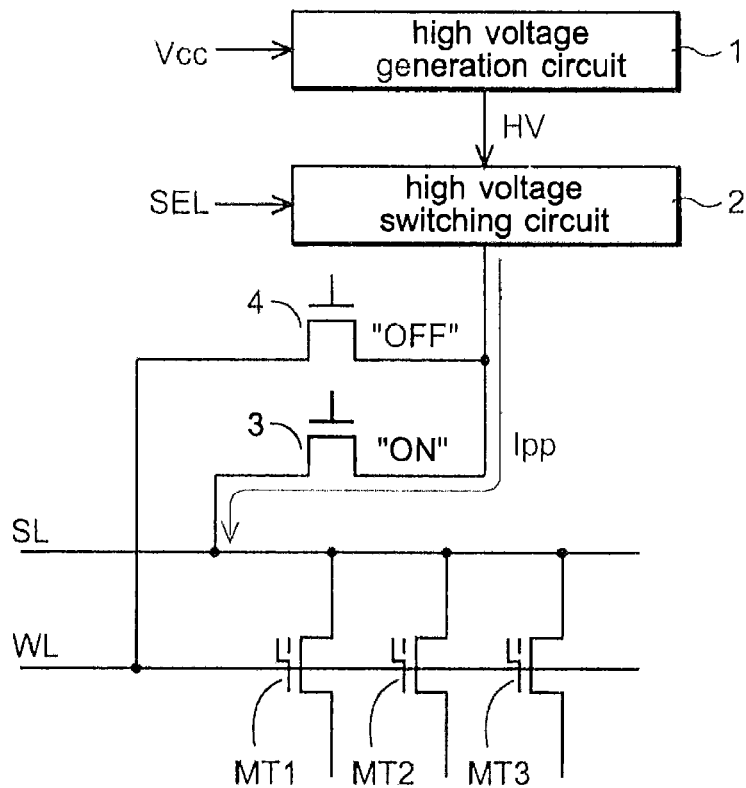
FIG. 4 is a circuit diagram for explaining a conventional semiconductor memory device.

Sources of a plurality of memory cell transistors MT1, MT2, MT3 and so on are commonly connected to the source line SL, and control gates of the plurality of memory cell transistors MT1, MT2, MT3 and so on are commonly connected to the word line WL. A word line decoder 16 selecting the word line WL is further provided. The plurality of memory cell transistors MT1, MT2, MT3 and so on are the memory cell transistors of the split gate type EEPROM shown in FIG. 3.

The output of the high voltage switching circuit 11 (the output of the second CMOS inverter INV2) is supplied to the source line SL through a first transfer gate 13, and supplied to the word line WL through a second transfer gate 14. The first transfer gate 13 is configured of a P-channel type MOS transistor of which on and off are controlled by a write enable signal WRT, and the second transfer gate 14 is configured of a P-channel type MOS transistor of which on and off are controlled by an erase enable signal ERA.

A third transfer gate 15 supplying the output of the high voltage generation circuit 10 to the source line SL without through the high voltage switching circuit 11 is further provided. The third transfer gate 15 is configured of a P-channel type MOS transistor, and an inverted output of the high voltage switching circuit 11 (the output of the first CMOS inverter INV1) is applied to the gate thereof. It is noted that the first transfer gate 13, the second transfer gate 14 and the third transfer gate 15 may be configured of CMOS transfer gates for reducing on-resistance.

Next, the writing operation of the above-described circuit will be described. When the selection signal SEL turns to H level, the setting MOS transistor 112 turns on, and the output of the high voltage switching circuit 11 turns to H level. The word line WL is set to H level (e.g. 2V) by the word line decoder 16. By this, the memory cell transistors MT1, MT2, MT3 and so on connected to the word line WL turn on.

The write enable signal WRT is set to L level and the erase enable signal ERA is set to H level, so that the first transfer gate 13 turns on and the second transfer gate 14 turns off. Furthermore, since the setting MOS transistor 112 turning on makes the inverted output of the high voltage switching circuit 11 (the output of the first CMOS inverter INV1) turn to L level, the third transfer gate 15 turns on accordingly.

Then, when the high voltage HV (e.g. 10V) is generated by the high voltage generation circuit 10, the output of the high voltage switching circuit 11 becomes the high voltage HV and is supplied to the source line SL through the first transfer gate 13. At the same time, the high voltage HV generated by the high voltage generation circuit 10 is supplied to the source line SL through the third transfer gate 15.

In the plurality of memory cell transistors, the drains of the memory cell transistors (e.g. MT1, MT2, MT3) where data is to be written are grounded through constant current circuits 17, and the H level is applied to the drain of the memory cell transistor (e.g. MTx) where data is not to be written. By this, writing currents (Ipp1, Ipp2) are supplied from the third transfer gate 15 and the high voltage switching circuit 11 to the memory cell transistors (e.g. MT1, MT2, MT3) where data is to be written. The constant current circuit 17 makes a constant writing current flow into the memory cell transistors where data is to be written. By this writing current flowing through the channels of the memory cell transistors, channel hot electrons are injected into the floating gates 106 through the gate insulation films 105. The channel hot electrons injected into the floating gates 106 are held as electric charge in the floating gates 106.

At this time, by setting the writing current Ipp1 of the third transfer gate 15 largely higher than the writing current Ipp2 from the high voltage switching circuit 11 (Ipp2<<Ipp1), the high voltage switching circuit 11 mainly performs a function of holding the high voltage HV (a latch function), and most of the writing current is supplied through the third transfer gate 15. This minimizes the circuit area, and reduces a voltage drop in a high voltage supply path to the source line SL. Then, the writing current supplied to the nonvolatile memory cell transistors is increased to achieve multi-bit simultaneous writing.

If the writing current is supplied from the high voltage generation circuit 10 through the first transfer gate 13 without through the third transfer gate 15, the writing current is flowed through the P-channel type MOS transistor 114 of the high voltage switching circuit 11 and the first transfer gate 13. However, since two MOS transistors are serially connected in the current path, the voltage drop is large. For securing the writing current, it is necessary to increase the sizes of the P-channel type MOS transistor 114 and the first transfer gate 13 (i.e. the channel widths of the MOS transistors). Since the latch circuit configured of the first and second inverters INV1 and INV2 loses its balance if only the P-channel type MOS transistor 114 is formed large, the four MOS transistors forming the first and second inverters INV1 and INV2 need be formed large. This largely increases the circuit area. On the contrary, since the third transfer gate 15 exclusive to supplying the writing current is provided in the embodiment, the high voltage switching circuit 11 contributes to holding the high voltage HV and the size of the transistor forming this may be small. This minimizes the circuit area.

Figure 2:
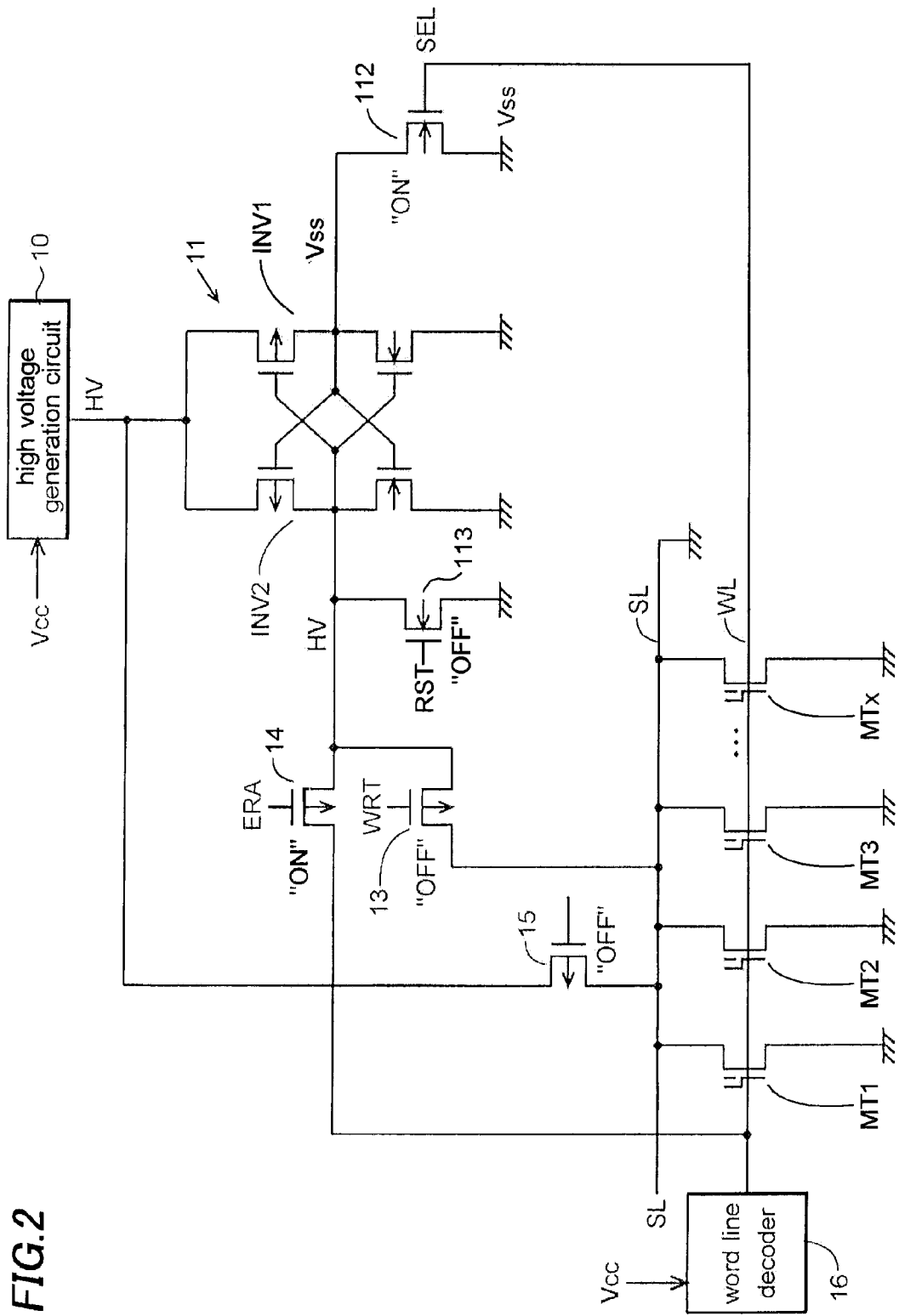

Next, the operation when data is erased will be described referring to FIG. 2. When the word line WL turns to H level (e.g. 3V) by the operation of the word line decoder 16, the setting MOS transistor 112 turns on, and the output of the high voltage switching circuit 11 turns to H level. Furthermore, since the write enable signal WRT is set to H level and the erase enable signal ERA is set to L level, the first transfer gate 13 turns off and the second transfer gate 14 turns on. The third transfer gate 15 is set to off.

Then, when the high voltage HV (e.g. 13V) is generated by the high voltage generation circuit 10, the output of the high voltage switching circuit 11 becomes the high voltage HV and this high voltage HV is supplied to the word line WL through the second transfer gate 14. The sources and drains of the memory cell transistors where data is to be erased are grounded. By this, a Fowler-Nordheim tunneling current flows in the tunnel insulation films 108 of the memory cell transistors, and the electrons accumulated in the floating gates 106 are extracted to the control gates (the word line WL), thereby completing the data erasing. Since the Fowler-Nordheim tunneling current is largely smaller than the writing current, the size of the second transfer gate 14 may be small.

The semiconductor memory device of the embodiment minimizes the circuit area and reduces the voltage drop in the high voltage supply path to the source line. This realizes the increase of the writing current supplied to the nonvolatile memory cell transistors to achieve the multi-bit simultaneous writing.

What is claimed is:

1. A semiconductor memory device comprising:
   a plurality of nonvolatile memory cell transistors that are electrically data erasable and writable;
   a source line connected to sources of the nonvolatile memory cell transistors;
   a word line connected to control gates of the nonvolatile memory cell transistors;
   a high voltage generation circuit generating a high voltage for erasing and writing data;
   a high voltage switching circuit switching in response to a selection signal and outputting the high voltage generated by the high voltage generation circuit;
   a first switch outputting the high voltage outputted by the high voltage switching circuit to the source line in response to a write enable signal;
   a second switch outputting the high voltage outputted by the high voltage switching circuit to the word line in response to an erase enable signal; and
   a third switch outputting the high voltage generated by the high voltage generation circuit to the source line bypassing the high voltage switching circuit in response to the write enable signal.

2. The semiconductor memory device of claim 1, wherein the high voltage switching circuit comprises a latch circuit set in response to the selection signal and receives the high voltage generated by the high voltage generation circuit as a supply voltage.

3. The semiconductor memory device of claim 1, wherein each of the first switch, the second switch and the third switch operates as a transfer gate.

4. The semiconductor memory device of claim 1, wherein each of the nonvolatile memory cell transistors comprises a source, a drain, a floating gate formed on a portion of a channel with a gate insulation film being interposed therebetween, an insulation film formed on the floating gate, a tunnel insulation film formed covering a side surface of the floating gate and the insulation film, and a control gate formed on the tunnel insulation film and a portion of the channel.

* * * * *